United States Patent [19]

Ronkainen

[11] Patent Number: 5,786,622

[45] Date of Patent: Jul. 28, 1998

[54] BIPOLAR TRANSISTOR WITH A RING EMITTER

[75] Inventor: Hannu O. Ronkainen, Espoo, Finland

[73] Assignee: TriTech Microelectronics International Ltd., Singapore, Singapore

[21] Appl. No.: 857,959

[22] Filed: May 16, 1997

[51] Int. Cl.[6] .................. H01L 27/082; H01L 27/102; H01L 29/70; H01L 31/11
[52] U.S. Cl. .................. 257/578; 257/579; 257/584; 257/592
[58] Field of Search .................. 257/578–584, 257/592

[56] References Cited

U.S. PATENT DOCUMENTS

| | | | |
|---|---|---|---|
| 4,151,542 | 4/1979 | Yajima et al. | 357/36 |
| 4,868,135 | 9/1989 | Ogura et al. | 437/31 |
| 4,951,108 | 8/1990 | Leduc | 257/579 |
| 5,352,924 | 10/1994 | Mahant-Shetti et al. | 257/565 |
| 5,409,845 | 4/1995 | Robinson et al. | 437/31 |
| 5,523,614 | 6/1996 | Hashimoto | 257/578 |
| 5,541,433 | 7/1996 | Lien | 257/378 |
| 5,572,063 | 11/1996 | Iranmanesh | 257/565 |

OTHER PUBLICATIONS

S. Wolf. "Silicon Processing for the VLSI Era–vol. 2" Lattice Press, Sunset Beach, CA, 1990, pp. 531 & 586.

*Primary Examiner*—Mahshid D. Saadat
*Assistant Examiner*—Allan R. Wilson
*Attorney, Agent, or Firm*—George O. Saile; Stephen B. Ackerman

[57] ABSTRACT

A novel ring shaped emitter structure with an extrinsic base and base contact in the central portion of the ring is described. This structural configuration is useful for improving the performance of bipolar transistors used in BiCMOS integrated circuits with only minimal changes to conventional CMOS processing technology. A single additional mask is required to form the intrinsic base region of the transistor. The emitter is diffused from a polysilicon layer which also serves as the emitter contact. The polysilicon layer overlies a perimeter portion of an active region defined by an opening in a field oxide and rises up over the field oxide itself. The active emitter region then forms a ring along the perimeter of the active region. The extrinsic base is formed through an opening within the polysilicon layer representing a central portion of the active region. This configuration improves transistor performance by reducing the characteristic spacings and thereby reducing component resistances and capacitances and increasing the cut-off frequency. The improved emitter-base design thereby results in higher bipolar transistor performance in BiCMOS integrated circuits at minimal cost.

19 Claims, 5 Drawing Sheets

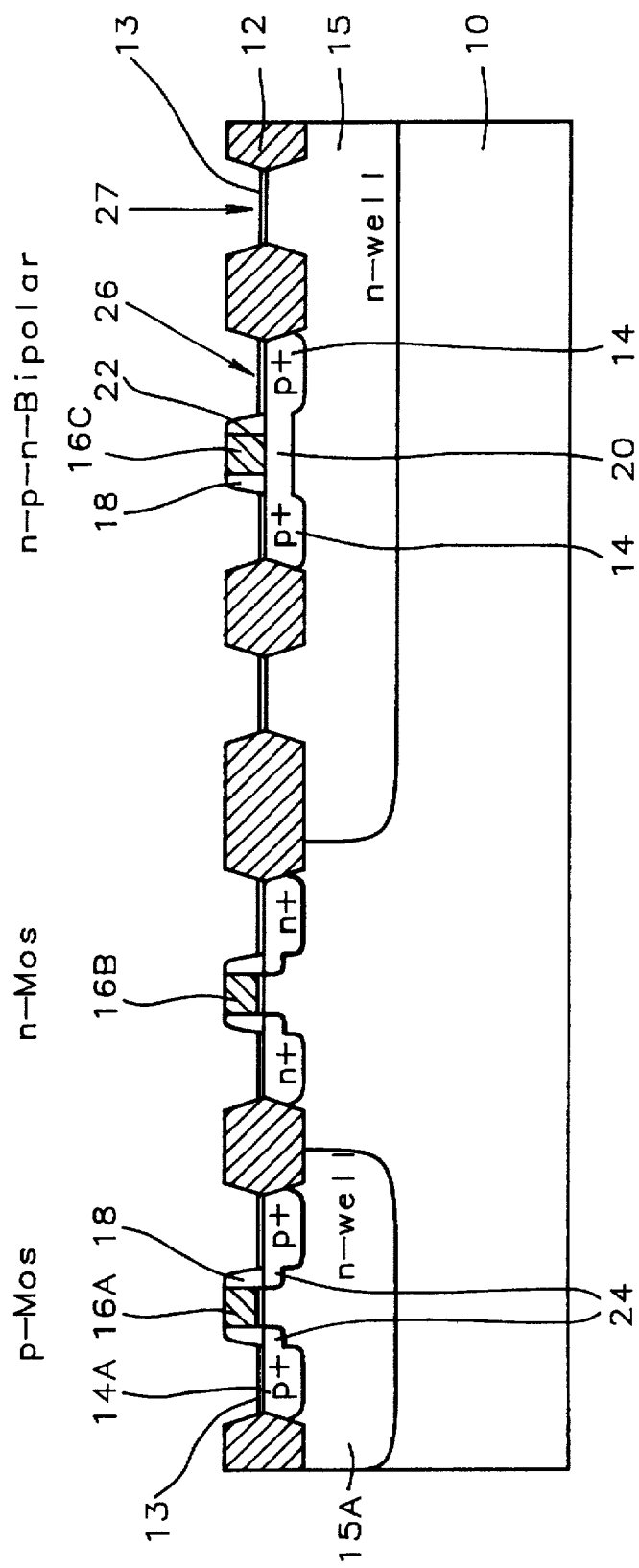
FIG. 2 – Prior Art

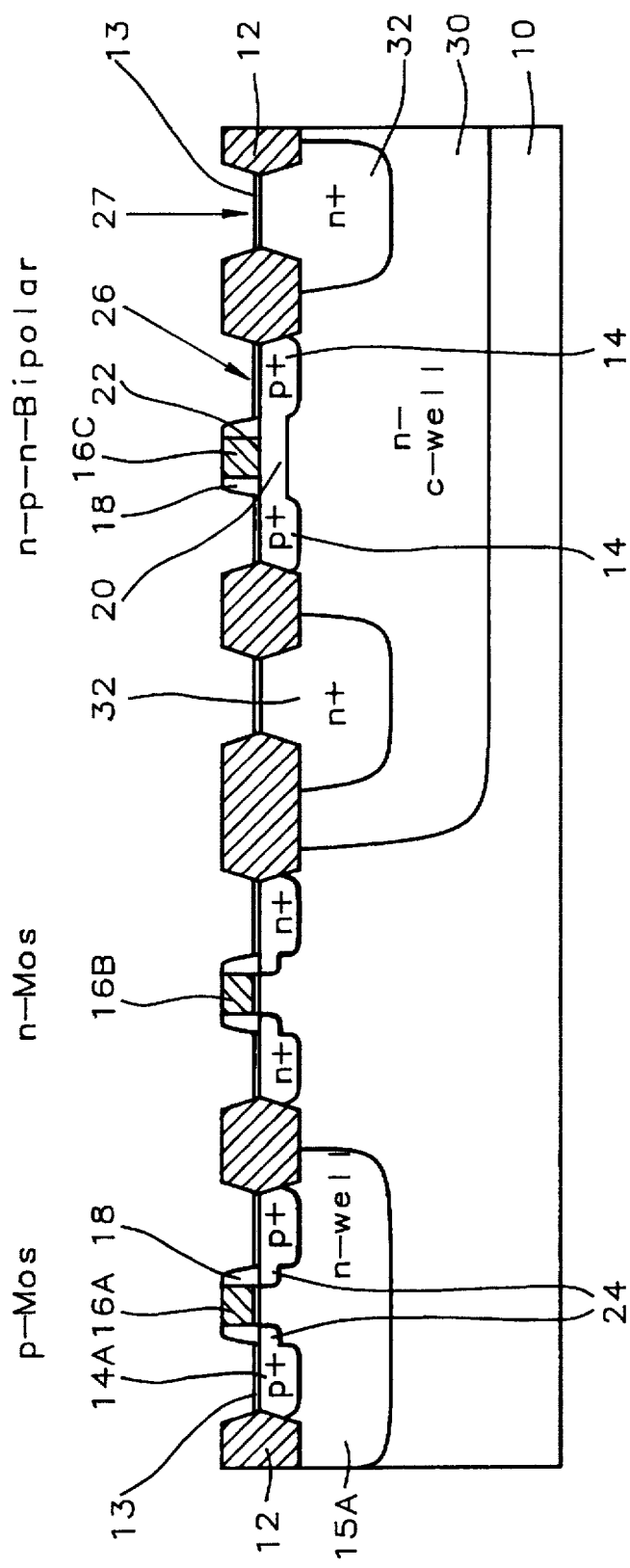
FIG. 3 – Prior Art

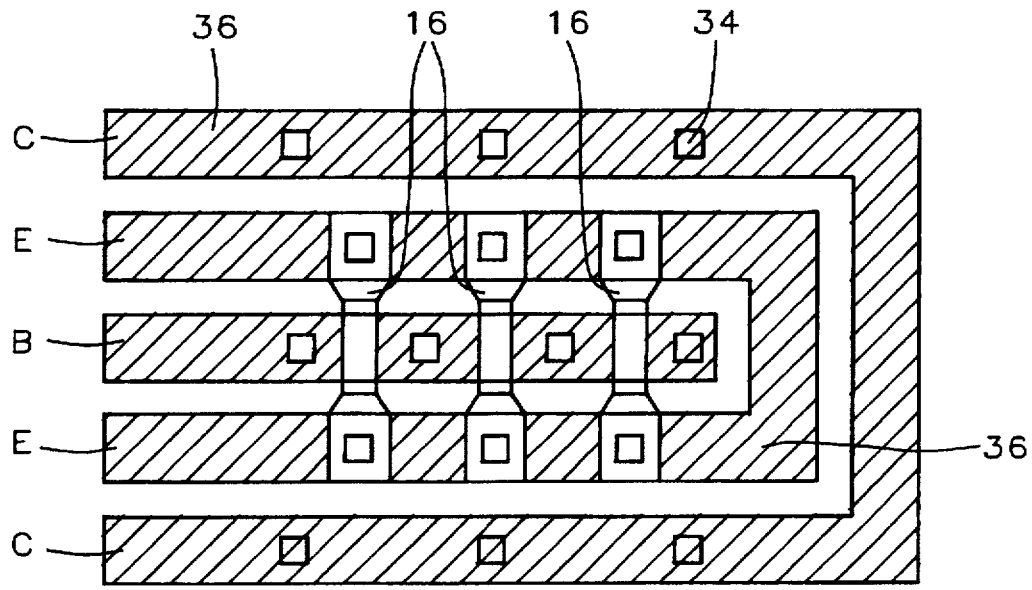
FIG. 4 – Prior Art
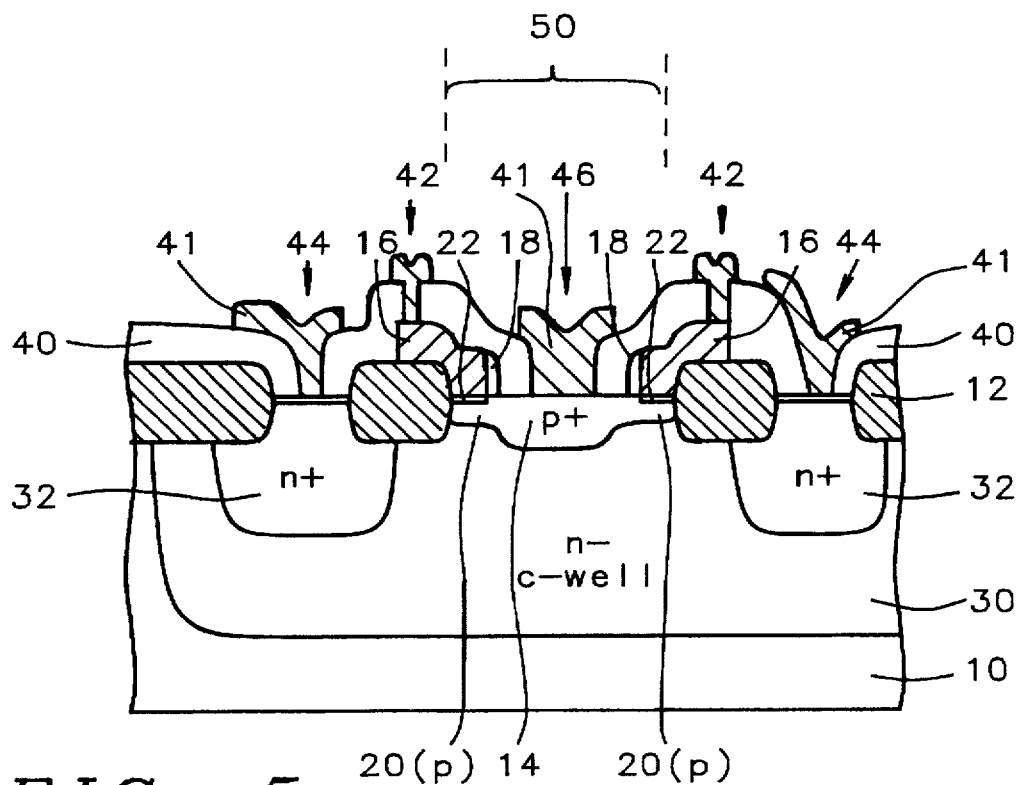
FIG. 5

BIPOLAR TRANSISTOR WITH A RING EMITTER

BACKGROUND OF THE INVENTION (1) Field of the Invention

The invention relates to the design of a bipolar junction transistors and more particularly to bipolar junction transistors used in BiCMOS integrated circuits.

(2) Description of Prior Art

Recent trends in integrated circuit design have seen the re-emergence of the bipolar junction transistor(BJT) as a useful companion to the MOS field-effect-transistor (MOSFET) which has dominated the technology for more than a decade. The BJT, although superior in speed and current driving capability to the MOSFET, was by-passed because of its somewhat greater cost and difficulty of manufacture, and its current and space requirements, by the MOSFET. However, in recent years, the processing advancements developed for use by complementary MOSFET (CMOS) technology, have provided a favorable environment for the incorporation of the BJTs into CMOS integrated circuits.

The use of p- and n-wells, developed for CMOS technology, now provide means to eliminate the need for epitaxial layers used in the earlier BJT designs with buried sub-collectors. The great strides made in recent years towards sub-micron definition of device components, along with the advancement of polysilicon technology have removed many of the competitive obstacles of the BJT. The technology which is now emerging from CMOS is a BiCMOS technology and involves the integration of BJTs into the CMOS environment.

The obvious utilization of BJTs is for input/output(I/O) functions while relegating the logic functions to the CMOS devices. More recently, however, bipolar devices are finding their way into the logic functions themselves in the form of BiCMOS logic gates, interface drivers, and even into SRAMs(static-random-access-memories). FIG. 1, taken from Wolf,S.,"Silicon Processing for the VLSI Era", Vol.2, Lattice Press, Sunset Beach, Calif., (1995), p586, illustrates the reduction in access time of SRAMs offered by BiCMOS technology.

The processing techniques developed for CMOS technology have made some of the critical features of the thin film bipolar transistor easier to control, in particular the base width and the emitter area. FIG. 2 is a cross sectional view showing a conventional bipolar transistor formed by a BiCMOS process. The CMOS devices are also shown. This particular configuration is sometimes referred to as a low cost or triple-diffused (3D) BiCMOS since it requires the least modification of the standard CMOS process. For further details regarding this device and other BiCMOS variations the reader is referred to Wolf,S.,"Silicon Processing for the VLSI Era", Vol.2, Lattice Press, Sunset Beach, Calif. (1990),p531ff. Only a single additional masking step is required to form the intrinsic base of the 3D BiCMOS transistor. The structures in this example are formed in a p-type silicon wafer 10. The processing steps which form the n-well regions 15A for the PMOS devices also provide the collector 15 for the npn bipolar transistor. The lateral base isolation is provided by the field oxide(FOX) 12 while the extrinsic base 14 is formed simultaneously with the source/drain implants 14A of the PMOS device. The polysilicon layer which forms gate electrodes 16A and 16B for the CMOS devices not only provides the emitter contact 16C but also provides the n-type dopant which is diffused into silicon surface above the intrinsic base region 20 during an annealing step to form the shallow emitter 22. The oxide sidewall structures 18 which are used in forming the lightly-doped-drains(LDD) 24 of the CMOS devices participate in the base formation of the bipolar transistor by keeping the heavily doped extrinsic base 14 away from the emitter-base junction. The collector contact 27 and base contact 26 are formed to active regions denoted by n+ and p+ respectively through openings in the gate oxide 13. The emitter contact is made to the polysilicon 16C.

The bipolar structure depicted by FIG. 2, although easily assimilated into the CMOS process, is not considered a high performance device. It suffers from a high collector resistance($R_c$) as well as high collector-base and emitter-base capacitances which compromise device performance. Generally, high performance bipolar transistors used in BiCMOS integrated circuits utilize highly doped buried sub-collectors formed within epitaxial layers to reduce $R_c$.

Enhancements to the low cost 3D process which serve to lower collector resistance $R_c$, each at the expense of additional masking and processing steps, are shown in FIG. 3. A special c-well 30 for the npn bipolar transistor is provided having a higher doping than those wells 15 provided for the PMOS devices. In addition, a deep, heavily doped contact implant 32 provides further reduction of $R_c$.

A top view of the bipolar device, shown in cross section in FIG. 2 and FIG. 3, is shown in FIG. 4. Here three polysilicon emitter stripes 16 are used to form three emitter diffusions into a common base with a common collector. The interconnecting metalization 36 is shown to illustrate how multiple contacts 34 are used to reduce series resistance and increase device performance. The letters C, E, and B refer to the collector, emitter, and base wiring respectively.

Self-aligned emitters derived from a polysilicon layer have been used successfully to form emitter-base configurations wherein the extrinsic base region can be precisely spaced from the emitter by using lateral oxide spacers. These techniques eliminate the need for mask mis-alignment tolerances in this area and therefore permit structural size reduction as well as improved consistency. Ogura et.al. U.S. Pat. No. 4,868,135 illustrates the use of sidewall spacers for extrinsic base-emitter self-alignment in a BiCMOS process. Robinson et.al. U.S. Pat. No. 5,409,845 provides an insulating ring encircling the emitter. However, the thickness of this ring is limited by the photolithography and it must be filled with oxide and etched back requiring additional, sensitive processing steps.

Yajima et.al. U.S. Pat. No. 4,151,542 describes a transistor having a plurality of circular ring shaped emitters formed within a common base region with each ring connected to a central contact diffusion by a ballast resistance and the contact regions interconnected in parallel. The resultant device is characterized by high power output while at the same time retaining the high-speed operability of a smaller unit. These transistors are designed for high power capability and are considerably different in both design and performance from those commensurate with BiCMOS applications.

SUMMARY OF THE INVENTION

It is an object of this invention to provide a design for a high performance bipolar junction transistor incorporated into a BiCMOS integrated circuit with minimal alterations of the CMOS processing technology without the use of epitaxial layers. In addition, the emitter-base configuration described by this invention will further improve the performance of bipolar transistors which utilize sub-collectors formed by the use of epitaxial layers.

This objective is accomplished in design, by the use of a self-aligned ring emitter surrounding a centrally located extrinsic base. The outer perimeter of the ring emitter is defined by an opening in a field oxide layer while the inner perimeter is defined by the perimeter of an opening within a doped polysilicon layer which overlies the intrinsic base. An oxide sidewall along the edge of the polysilicon opening provides a transition band from the intrinsic base to the subsequently implanted extrinsic base in the center of the opening. The transition band keeps the extrinsic base region from encroaching below the emitter. Collector resistance and collector-base capacitance are reduced by having the intrinsic base closer to the collector contact. At the same time the base resistance is reduced by having the base contact closer to the intrinsic base region than in the conventional stripe emitter design. The ring emitter with multiple contacts provides a reduced emitter resistance over the conventional stripe emitter design. Collector contacts are formed in a larger ring, concentric with the emitter ring and separated from it by a band of field oxide.

Although the performance of the low cost (3D) bipolar transistor is significantly improved by the use of the ring-emitter-base structure alone, additional performance enhancements may also be applied to further reduce the collector resistance by incorporating a collector well more heavily doped than the corresponding wells used by the CMOS devices and by providing a more heavily doped collector contact opening. Each of these enhancements serve to further lower $R_c$. However, they each require additional processing steps. These enhancements may be used separately or together in conjunction with the ring-emitter-base configuration to achieve the degree of transistor performance desired. The reduction of base-collector junction capacitance, $R_c$, and base resistance $R_{BB}$ afforded by the ring emitter design taught by this invention, results in an increase of the transistor cut-off frequency $f_T$ by at least 20%.

BRIEF DESCRIPTION OF THE DRAWINGS

FIG. 2 is a cross section of a bipolar junction transistor formed by using CMOS technology with the addition of a single base mask.

FIG. 3 is a cross section of a bipolar junction transistor formed by using CMOS technology with the addition collector resistance reducing enhancements requiring additional masks and process steps.

FIG. 4 is a top view of a typical bipolar junction transistor having multiple emitter stripes in a common base and collector configuration.

FIG. 5 is a cross sectional view of a bipolar transistor having a ring emitter formed according to the design of this invention.

DESCRIPTION OF THE PREFERRED EMBODIMENTS

A preferred embodiment of this invention is shown in cross section in FIG. 5. A p-type silicon substrate is provided. An npn bipolar transistor is formed in a collector well 30 akin to the one shown in FIG. 3. The well is doped with phosphorous to achieve a doping of between $1\times10^{16}$ and $1\times10^{17}$ atoms/cm$^3$.

Figure 1:
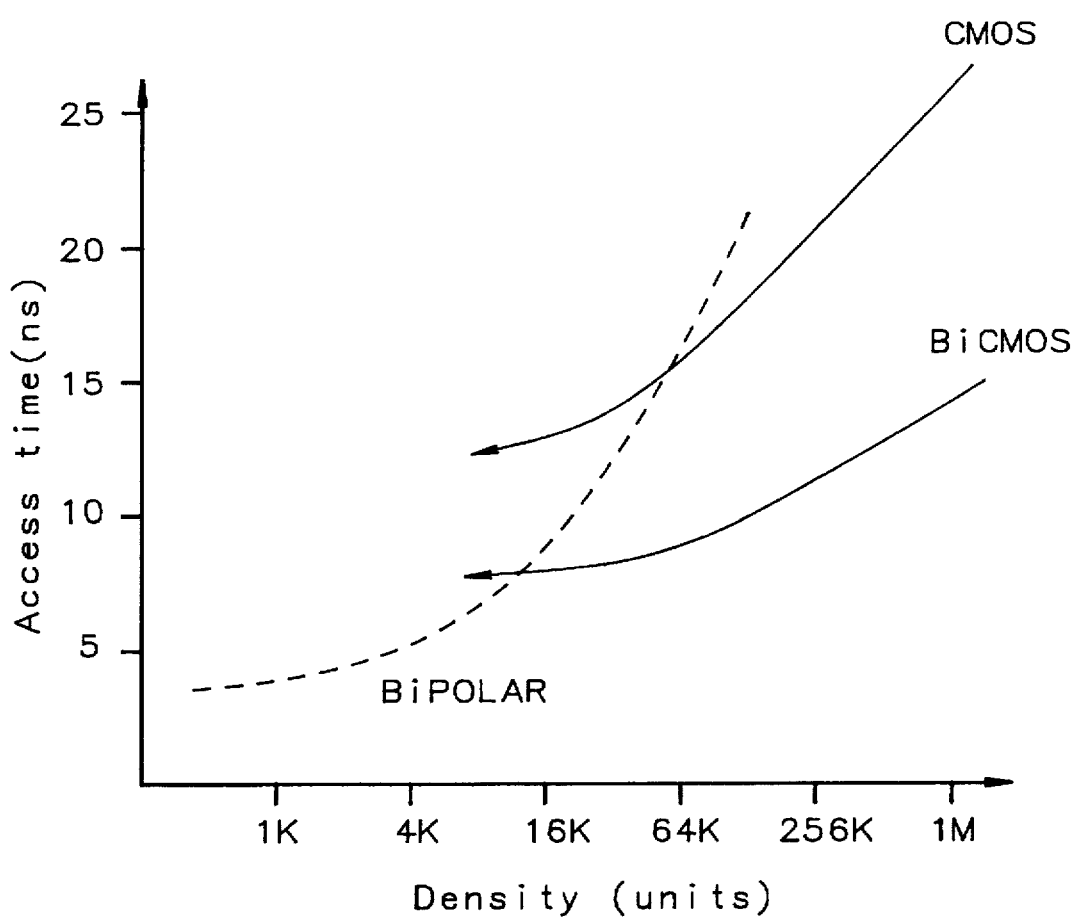
FIG. 1 illustrates the reduction in access time of SRAMs offered by BiCMOS technology.
Figure 6:
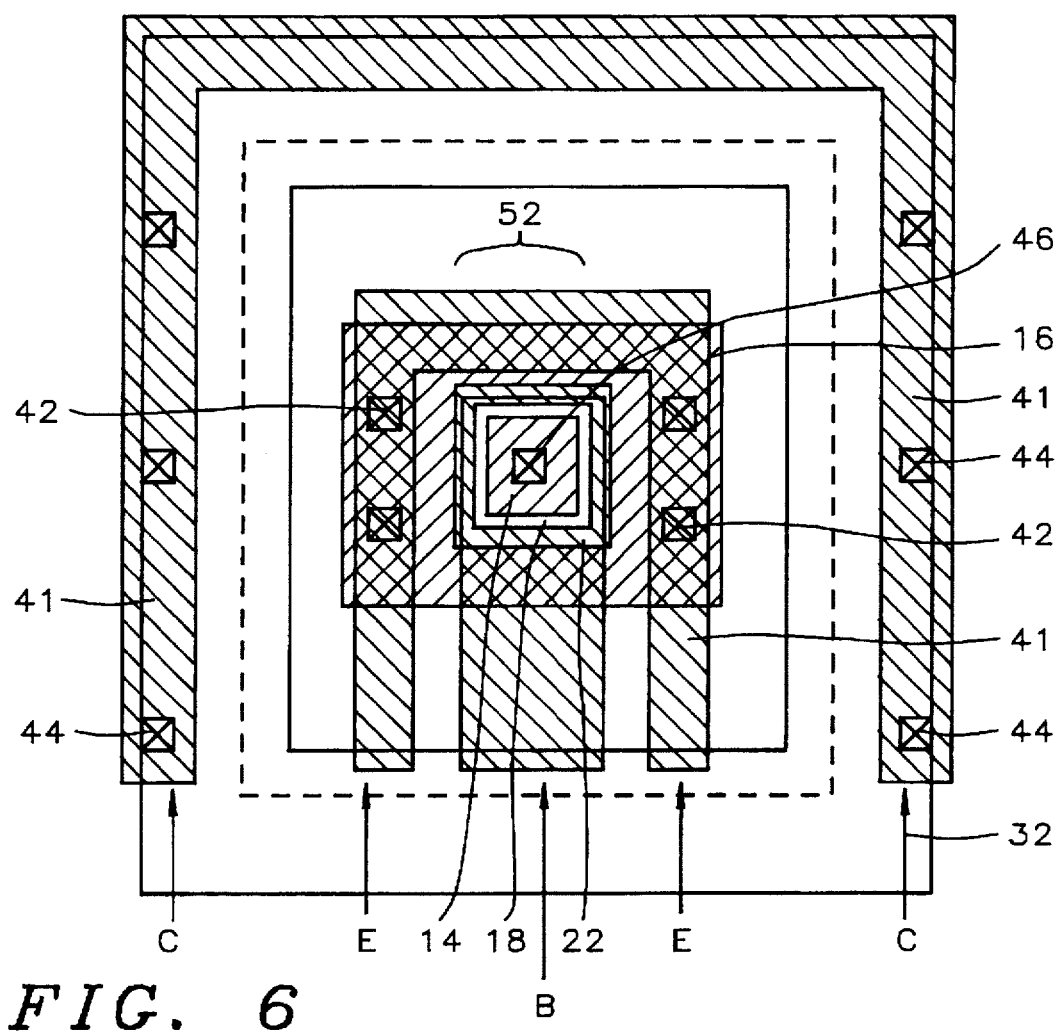
FIG. 6 it a top view of a bipolar transistor having a ring emitter formed according to the design of this invention.

The transistor emitter and base are formed within an opening 50 in the field oxide (FOX) 12. This opening can be best visualized by referring to the top view of the structure which is shown in FIG. 6. Here the opening 50 in the field oxide is shown as the outer perimeter of the square 22 which is also the outer perimeter of the active emitter. Boron is implanted into this field oxide opening to form the intrinsic base 20. A polysilicon layer 16 is deposited and patterned with an interior opening to define the inner perimeter of the active emitter. The polysilicon pattern extends out over the field oxide 12 where the emitter contacts 42 are made to it. The polysilicon layer is in-situ doped with arsenic, or it may be doped by ion implantation after deposition. After patterning the layer 16 provides the dopant source for the emitter 22. An oxide sidewall spacer 18 is provided along the inside edge of the polysilicon pattern 16. The extrinsic base 14 is implanted into the central region of the opening and is prevented from encroaching into the intrinsic base region 20 under the emitter 22 by the sidewall spacer 18 thereby providing a gradual transition of the intrinsic base 20 to the extrinsic base in the same fashion that the lightly doped drains (24 in FIG. 3) of the MOSFETs are formed.

Arsenic doping of the collector contact regions is accomplished by an implant of between about $1\times10^{15}$ and $2\times10^{15}$ atoms/cm$^2$ at energies of between 50 and 150 keV to form a deep n-plug band 32 which surrounds the band of field oxide(FOX) encompassing the emitter-base structure.

Finally an insulative layer 40 is deposited over the wafer and collector contact openings 44, the emitter contact openings 42 and the single extrinsic base contact 46 is made in the center of the structure. A subsequent metallization pattern 41 joins the collector contacts 44 to one conductor C, the emitter contacts 42 to a second conductor E and the single base contact 46 to a third conductor B.

In the first embodiment the emitter base structure was used along with the collector enhancements 30 and 32. Each of these enhancements requires an additional photolithographic masking step and additional processing steps. Each of these enhancements individually improve transistor performance by lowering collector resistance. In a second embodiment where the performance improvement provided by the ring emitter-base configuration described in the first embodiment alone is sufficient, these enhancements are eliminated. Only a single additional mask for the formation of the intrinsic base is required to include npn bipolar transistors in the CMOS process.

The performance improvements for various BJT enhancements is illustrated by the data given in Table I. The reduction of base-collector junction capacitance, $R_c$, and base resistance $R_{BB}$ afforded by the ring emitter design taught by this invention, results in an increase of the transistor cut-off frequency $f_T$ by at least 20%.

TABLE I

| Device Performance Improvements for various BJT Enhancements | |
|---|---|
| | $f_T$ (gHz) |
| Without n-plug or c-well | 11 |
| With n-plug and c-well | 15 |
| With Ring Emitter alone | 14 |
| With n-plug, c-well, & Ring Emitter | 18 |

While this invention has been particularly shown and described with reference to the preferred embodiments thereof, it will be understood by those skilled in the art that various changes in form and details may be made without departing from the spirit and scope of the invention.

While the embodiments of this invention utilize a p-type silicon substrate, an n-type silicon substrate could also be used without departing from the concepts therein provided. It should be further understood that the substrate conductivity type as referred to herein does not necessarily refer to the conductivity of the starting wafer but could also be the conductivity of a diffused region within a wafer wherein the semiconductor devices are incorporated. Thus a pnp transistor would be formed in a p-type collector well.

The term "ring" as used in describing this invention and in the claims is meant to include any planar shape having an outer perimeter and a single opening in the interior. Thus a ring could be of rectangular, circular, or irregular shape. The band formed between the inner and outer perimeters of the ring need not be uniform in width nor need it necessarily form a closed loop.

What is claimed is:

1. An emitter-base structure for a bipolar junction transistor comprising:
   a silicon wafer having formed within its surface a collector element of said bipolar junction transistor;
   a field oxide over said silicon wafer;
   an opening in said field oxide exposing an area of silicon wherein said emitter-base structure is formed;
   an intrinsic base of a first configuration formed within said silicon wafer in said opening having a ring shape with an outer perimeter defined by the perimeter of said opening;
   an emitter overlying said intrinsic base having a ring shape, the outer perimeter of said emitter being defined by the perimeter of said opening in said field oxide, and the inner perimeter of said emitter outlining a central region smaller than said opening by the width of said emitter;
   a polysilicon layer whose outer perimeter extends over said field oxide surrounding said opening and having an open region which coincides with said central region;
   an oxide sidewall spacer formed along the inner perimeter of said polysilicon layer having a thickness which forms a band laterally adjacent to the inner perimeter of said emitter thereby covering a portion of said central region; and
   an extrinsic base of a second configuration formed within that portion of said central region not covered by said oxide sidewall whereby said extrinsic base is displaced away from the inner edge of said emitter by the width of said spacer and whereby there exists a transition region from said extrinsic base to said intrinsic base beneath said spacer.

2. The structure of claim 1 wherein said oxide sidewall overlies a transition region from said intrinsic base to said extrinsic base, external to that portion of said intrinsic base which lies subjacent to said emitter thereby preventing encroachment of said extrinsic base under said emitter and displacing said extrinsic base from the edge of said emitter.

3. The structure of claim 1 wherein an emitter-base junction is formed between about 0.05 and 0.2 microns below said surface.

4. The structure of claim 1 wherein the intrinsic base width is between 0.1 and 0.3 microns.

5. The structure of claim 1 further comprising:
   an insulative layer formed over said silicon wafer wherein are formed a plurality of contacts to said collector element, a plurality of contacts to said polysilicon layer lying over said field oxide, and a contact to said extrinsic base.

6. The structure of claim 5 wherein the edge to edge spacing between said base contact and said intrinsic base is between 0.05 and 0.2 microns.

7. The structure of claim 1 wherein said emitter is n-type.

8. The structure of claim 7 wherein said polysilicon layer is doped with an impurity selected from the group consisting of arsenic and phosphorous at a concentration of between about $1 \times 10^{20}$ and $4 \times 10^{20}$ atoms/cm$^3$.

9. The structure of claim 1 wherein said emitter is p-type.

10. The structure of claim 9 wherein said polysilicon layer is doped with boron at a concentration of between about $1 \times 10^{19}$ and $2 \times 10^{20}$ atoms/cm$^3$.

11. A bipolar junction transistor having a ring emitter comprising:
   a silicon wafer having formed within its surface a collector element of said bipolar junction transistor;
   a field oxide over said silicon wafer;
   a first opening in said field oxide exposing active silicon located over said collector element;
   a second opening in said field oxide located over said collector element in the shape of a ring surrounding said first opening and spaced from it by a continuous band of field oxide;
   an intrinsic base of a first configuration formed within said silicon wafer in said first opening having a ring shape with an outer perimeter defined by the perimeter of said first opening;
   an emitter over said intrinsic base having a ring shape, the outer perimeter of said emitter being defined by the perimeter of said first opening in said field oxide, and the inner perimeter of said emitter outlining a central region smaller than said first opening by the width of said emitter;
   a polysilicon layer whose outer perimeter extends over said field oxide surrounding said first opening and having an open region which coincides with said central region;
   an oxide sidewall spacer formed along the perimeter of said open region having a thickness which forms a band laterally adjacent to the inner perimeter of said emitter thereby covering a portion of said central region;
   an extrinsic base of a second configuration formed within that portion of said central region not covered by said oxide sidewall whereby said extrinsic base is displaced away from the inner edge of said emitter by the width of said spacer and whereby there exists a transition region from said extrinsic base to said intrinsic base beneath said spacer; and
   an insulative layer formed over said silicon wafer wherein are formed a plurality of contacts to said collector element, a plurality of contacts to said polysilicon layer lying over said field oxide, and a contact to said extrinsic base.

12. The structure of claim 11 wherein said oxide sidewall overlies a transition region from said intrinsic base to said extrinsic base, external to that portion of said intrinsic base which lies subjacent to said emitter thereby preventing encroachment of said extrinsic base under said emitter and displacing said extrinsic base from the edge of said emitter.

13. The structure of claim 11 wherein the edge to edge spacing between said collector contact and said intrinsic base is between about 2 and 4 microns.

14. The structure of claim 11 wherein an emitter-base junction is formed between about 0.05 and 0.2 microns below said surface.

15. The structure of claim 11 wherein the intrinsic base width is between 0.1 and 0.3 microns.

16. The structure of claim 11 wherein said emitter is n-type.

17. The structure of claim 16 wherein said polysilicon layer is doped with an impurity selected from the group consisting of arsenic and phosphorous at a concentration of between about $1 \times 10^{20}$ and $4 \times 10^{20}$ atoms/cm$^3$.

18. The structure of claim 11 wherein said emitter region is p-type.

19. The structure of claim 18 wherein said polysilicon layer is doped with boron at a concentration of between about $1 \times 10^{19}$ and $2 \times 10^{20}$ atoms/cm$^3$.

* * * * *